United States Patent [19]

Erb et al.

[11] Patent Number: 5,215,937
[45] Date of Patent: Jun. 1, 1993

[54] OPTIMIZING DOPING CONTROL IN SHORT CHANNEL MOS

[75] Inventors: Darrell M. Erb, Los Altos; Rajat Rakkhit, Milpitas; Farrokh Omid-Zohoor, Sunnyvale, all of Calif.

[73] Assignee: Advanced Micro Devices, Inc., Sunnyvale, Calif.

[21] Appl. No.: 881,001

[22] Filed: May 7, 1992

[51] Int. Cl.$^5$ .......................................... H01L 21/266
[52] U.S. Cl. ..................... 437/45; 437/164; 148/DIG. 111
[58] Field of Search ................ 437/40, 41, 44, 45, 437/69, 70, 164, 984; 148/DIG. 45, DIG. 111

[56] References Cited

U.S. PATENT DOCUMENTS

| | | | |
|---|---|---|---|
| 4,080,718 | 3/1978 | Richman | 437/45 |
| 4,197,630 | 4/1980 | Kamprath | 437/45 |
| 4,356,042 | 10/1982 | Gedaly et al. | 437/45 |
| 4,378,627 | 4/1983 | Jambotkar | 437/70 |
| 4,499,652 | 2/1985 | Shrivastava | 437/45 |
| 4,954,459 | 9/1990 | Avanzino et al. | 437/238 |
| 4,977,108 | 12/1990 | Haskell | 437/41 |
| 5,073,512 | 12/1991 | Yoshino | 437/45 |
| 5,116,778 | 5/1992 | Haskell et al. | 437/164 |

OTHER PUBLICATIONS

Al F. Tasch et al, "Limitations of LDD Types of Structures in Deep-Submicrometer MOS Technology", in *IEEE*, vol. 11, No. 11, pp. 517-519 (Nov. 1990).

Ryuichi Izawa et al, "Impact of the Gate-Drain Overlapped Device (GOLD) for Deep Submicrometer VLSI", in *IEEE*, vol. 35, No. 12, pp. 2088-2093 (Dec. 1988).

James R. Pfester et al, "An ITLDD CMOS Process with Self-Aligned Reverse-Sequence LDD/Channel Implantation", in *IEEE*, vol. 38, No. 11, pp. 2460-2464 (Nov.).

*Primary Examiner*—Brian E. Hearn
*Assistant Examiner*—C. Chaudhari
*Attorney, Agent, or Firm*—Benman & Collins

[57] ABSTRACT

An improved process is provided for fabricating short channel complementary metal oxide semiconductor devices. The devices comprise source and drain regions separated by gate regions. The process comprises forming a shallow channel doping region (12') beneath the surface of a semiconductor (10) and forming source-drain regions (20') of opposite conductivity type (formerly known as lightly doped drain structures) on either side of the shallow doping region. A gate oxide (16) is formed on the surface of the semiconductor above the shallow channel doping region and a gate electrode (18) is formed to the gate oxide subsequent to the formation of the shallow channel doping region. The process permits spacing of the channel doping from the source-drain doping with self-alignment. Further, the doping of the source-drain regions is not constrained to the values of the lightly-doped structures of the prior art.

14 Claims, 5 Drawing Sheets

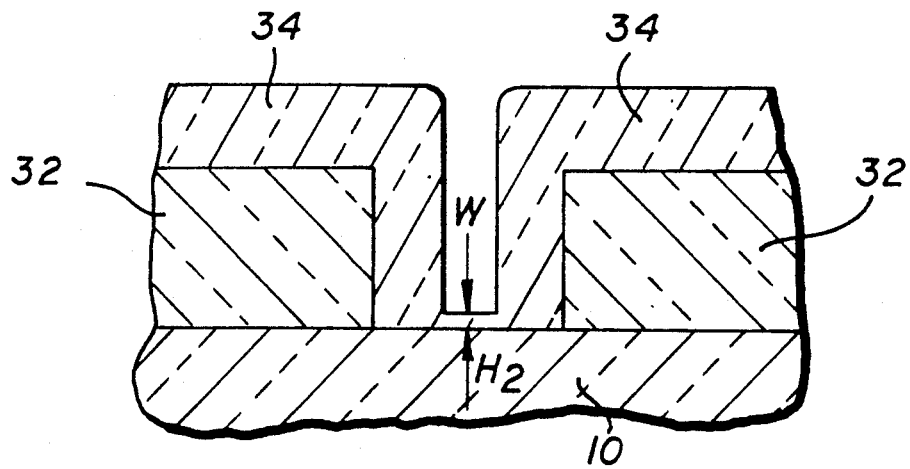
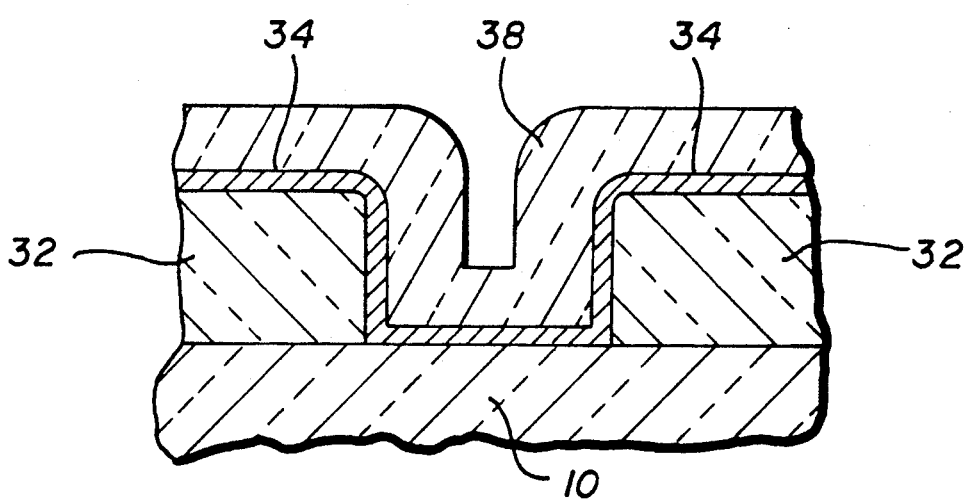
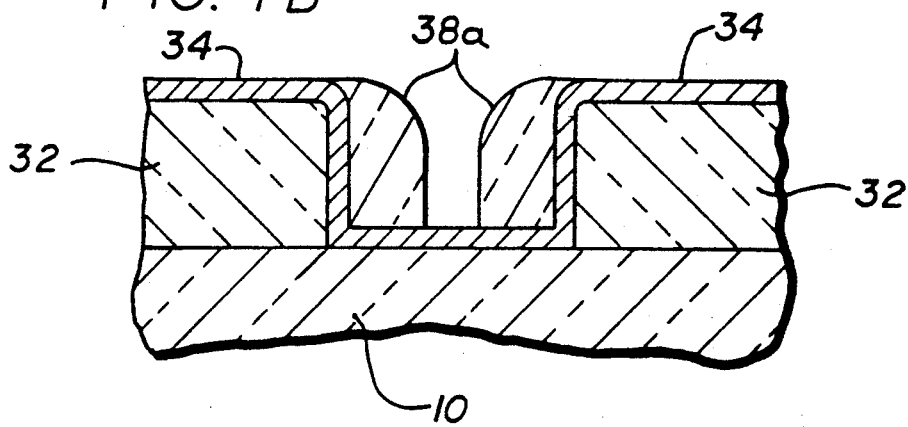

OPTIMIZING DOPING CONTROL IN SHORT CHANNEL MOS

CROSS-REFERENCE TO RELATED APPLICATION

The present application is related to U.S. patent application Ser. No. 07/881,002, filed May 7, 1992 and assigned to the same assignee as the present application. The two applications differ in the timing in the sequence for forming the short channel doping region and in the composition of the mask used during ion implantation to form the short channel doping region.

TECHNICAL FIELD

The present invention relates to metal oxide semiconductor (MOS) transistors, and, more particularly, to methods for scaling complementary (CMOS) transistors into the deep sub-micrometer range.

BACKGROUND ART

Attempts continue to shrink the dimensions for fabric MOS transistors. Devices having sub-micrometer dimensions permit closer placement of devices, thereby increasing the density of devices on a chip and also increasing device operating speed.

There are many types of lightly-doped drain (LDD) transistors presently in use, which are reviewed by Tasch et al, *IEEE Electron Device Letters*, Vol. 11, No. 11, pp. 517-519 (1990). In order to reduce the dimensions even further, based on device simulations, it appears that the scaled device must have shallow N$^-$LDD junctions to overcome charge sharing and doping compensation effects. This permits devices with acceptable short channel threshold and drain induced barrier lowering (DIBL) effects. However, when the peak N$^-$doping level is increased high enough for acceptable on-resistance, the drain field increases, giving rise to unacceptably high substrate and gate currents.

The so-called GOLD (gate overlapped drain) transistor, described by R. Izawa et al, *IEEE Transactions on Electron Devices*, Vol. 35, pp. 2088-2093 (1988) overcomes the N$^-$resistance problem by inducing a channel in the LDD regions with the overlapping gate. This comes at the expense of lower packing density and large Miller capacitance.

Thus, there remains a need for a process for fabricating CMOS transistors having channel lengths down to 0.35 micrometers.

DISCLOSURE OF INVENTION

In accordance with the invention, an improved process is provided for fabricating short channel complementary metal oxide semiconductor devices. The devices comprise source and drain regions separated by gate regions. The conventional process of forming a shallow channel doping region includes forming the shallow channel doping region beneath the surface of a semiconductor following formation of a deeper well of the same conductivity type therein, forming lightly doped drain structures on either side of the shallow doping region (after defining the polysilicon), forming a gate oxide on the surface of the semiconductor above the shallow channel doping region and extending over a portion of the lightly doped drain structures adjacent the shallow channel doping region, and forming a gate electrode to the gate oxide.

The process of the invention comprises forming the lightly doped drain structures, termed "source-drain regions of opposite conductivity type" herein, so as to leave a space between the source-drain regions of opposite conductivity type and the shallow channel doping region, implanting an impurity through the layer of sufficient dose to form the shallow channel doping region between the lightly doped drain structures and spaced apart therefrom by a spacing distance S, forming the gate oxide, forming a layer which includes the gate electrode (e.g., of polysilicon), and removing excess polysilicon to leave the gate electrode.

Other objects, features, and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

FIGS. 6A and 6B depict a variation of the process of the invention; and

FIGS. 7A and 7B depict another variation of the process of the invention.

BEST MODES FOR CARRYING OUT THE INVENTION

Reference is now made in detail to a specific embodiment of the present invention, which illustrates the best mode presently contemplated by the inventors for practicing the invention. Alternative embodiments are also briefly described as applicable.

Figure 1:
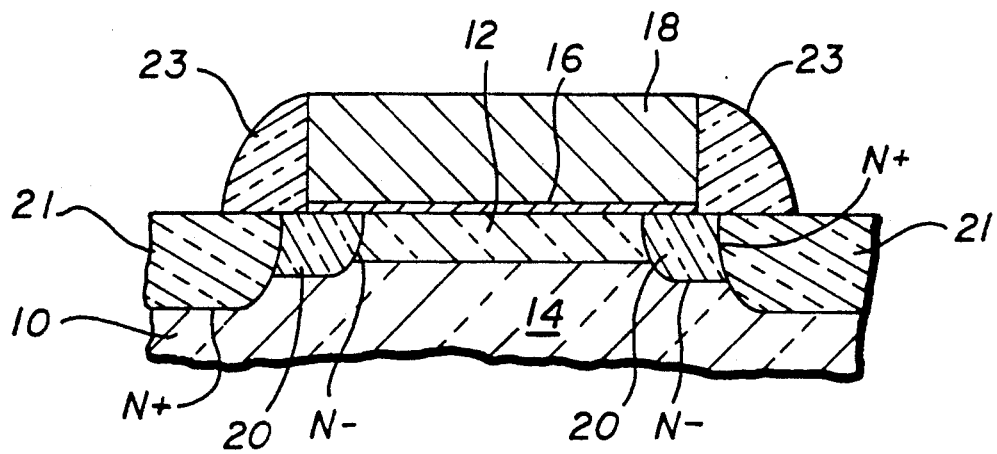
FIG. 1 is a cross-sectional view showing a prior art device having a shallow p-type doping region extending over the entire channel and LDD regions.

FIG. 1 depicts a prior art structure with the shallow LDD junctions that give the good short channel threshold and DIBL properties. Essentially, a substrate 10 is provided with a shallow p-type doping region 12 that extends across the entire gate; beneath the shallow doping region is a p-type well 14. The lateral extent of the p-well 14 is not defined in these FIGS., and goes far beyond the locality of the transistor depicted herein. Indeed, several transistors may use the same p-well. The line separating 12 from 14 is only to designate the transistor from the deep doping 14 to the shallow surface region 12.

Gate oxide 16 is formed on top of the semiconductor surface 10, and gate polysilicon layer 18 formed there-over. LDD regions 20 of N−doping are then formed. The LDD regions 20 are normally implanted using the gate electrode as a mask for self-alignment. The extension of the LDD region 20 underneath the gate oxide 16 is due to subsequent diffusion steps.

To be complete, all LDD transistors in the prior art have N+ doping regions 21 which are implanted and masked by the gate electrode 18 and an oxide spacer 23. Typically, the oxide spacer 23 has been deposited and anisotropically etched, leaving a fillet of material on the sidewalls of the polysilicon electrode 18, as shown in FIG. 1.

The process of the presently forming shallow p-type channel doping is set forth in, for example, U.S. Pat. Nos. 4,974,055, issued on Nov. 27, 1990, and 4,977,108, issued on Dec. 11, 1990, both to Jacob D. Haskell and assigned to the same assignee as the present application. See also U.S. Pat. No. 4,954,459, issued on Sept. 4, 1990, to Steven C. Avanzino and Jacob D. Haskell, and U.S. patent application Ser. No. 07/474,614, filed Feb. 5, 1990, by Jacob D. Haskell et al, both assigned to the same assignee as the present application.

The amount of shallow p-type channel doping 12 is set by the thickness of the gate oxide 18 to give the correct long channel threshold. The deeper channel doping 14 is determined by punch-through considerations. The shallow p-type doping sets the high field condition and the hot carrier effects. It is important to note that the channel doping is uniform along the channel because the channel impurities are implanted prior to gate definition.

Figure 2:
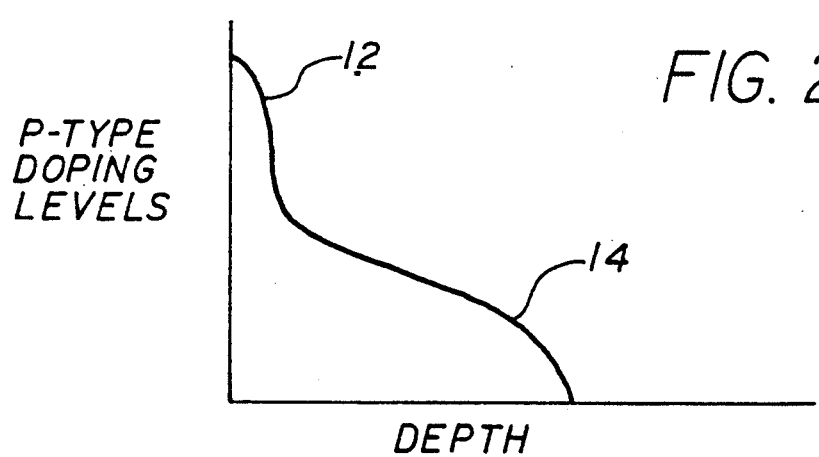
FIG. 2, on coordinates of doping level and depth, is the doping profile of the device of FIG. 1, measured from the surface of the transistor down into the p-well.

FIG. 2 depicts the doping profile for the device of FIG. 1, showing two portions, the shallow p-type doping 12 and the deep p-type doping 14 (for punch-through). The doping profile shown here is for a p-well version of a CMOS process. For an n-well version of CMOS and for an n-channel MOS process, the p-type doping would extend down through the entire silicon wafer.

Figure 3:
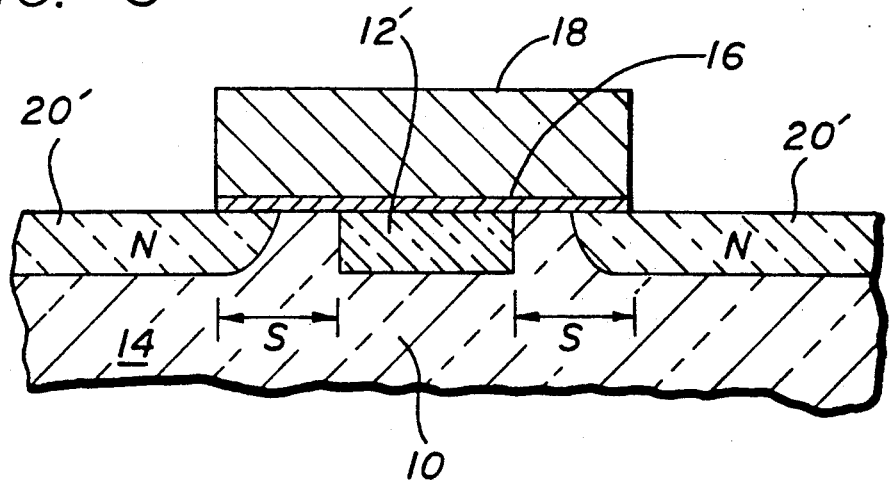
FIG. 3 is a cross-sectional view showing the structure of the device fabricated by the process of the invention, depicting shallow p-type doping separated from the N doping (source-drain regions of opposite conductivity type) by space S.

FIG. 3 depicts schematically the result of employing the method of the invention. Instead of the shallow p-type doping spreading over the entire gate and LDD region, it is confined to just the center of the channel, as shown at 12'. Furthermore, a method is provided of carefully controlling the spacing S of the channel doping from the $N^{31}$ doping 20. With this extra control parameter, it is possible to arbitrarily increase the N−doping to acceptable levels for good conduction. As the N−doping is increased to N, S can be increased independently to satisfy electric field requirements for a particular maximum drain voltage. As a result, this formerly "lightly doped drain" structure becomes a "source-drain region of the opposite conductivity type" and is denoted 20' in the structures of the invention to reflect the increased doping level.

Figure 4A:
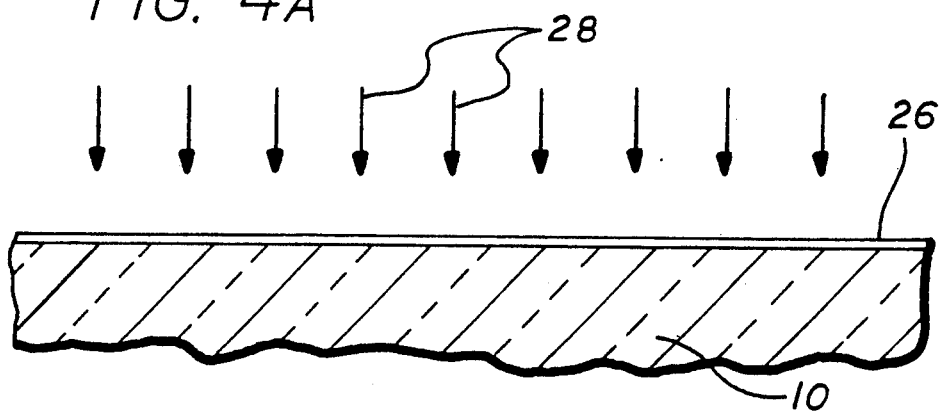
FIGS. 4A-G depict, in cross-section, the process sequence of the invention.

The process sequence is depicted in FIGS. 4A–G. Initially, a deep well implant, at about 3 to $10 \times 10^{12}$ /cm$^2$, is done through an oxide layer 26 formed on a semiconductor (here, silicon) substrate 10 The oxide layer 26 is to protect the silicon surface from contamination and is about 200 Å thick. The implantation, shown in FIG. 4A, is represented by arrows 28. The oxide layer 26 is then stripped from the active areas with a buffered HF etch. Transistor isolation steps, such as forming trenches and backfilling with oxide, as described in the afore-mentioned Avanzino and Haskell U.S. Pat. No. 4,954,459, are done next.

A phosphosilicate glass (PSG) layer 30 is then deposited, and is formed on the surface of the substrate 10 in the active areas. The glass layer 30 is about 300 to 1,000 Å thick and has a phosphorus concentration of about 0.5 to 3.0 wt%. The details of forming this layer are described in the afore-mentioned U.S. patent application Ser. No. 07/474,614.

An oxide layer 32 is then deposited on the phosphosilicate glass layer 30. Preferably, the oxide is tetraethyl orthosilicate (TEOS), formed by low pressure chemical vapor deposition (LPCVD), and is about 3,000 to 8,000 Å thick.

Figure 4B:
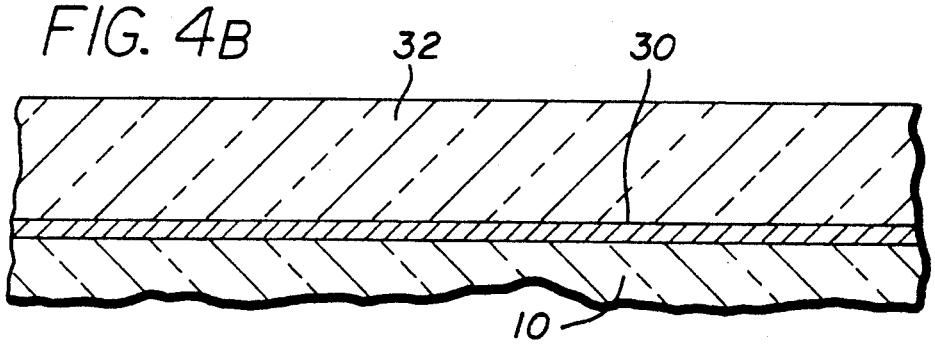
Figure 4C:
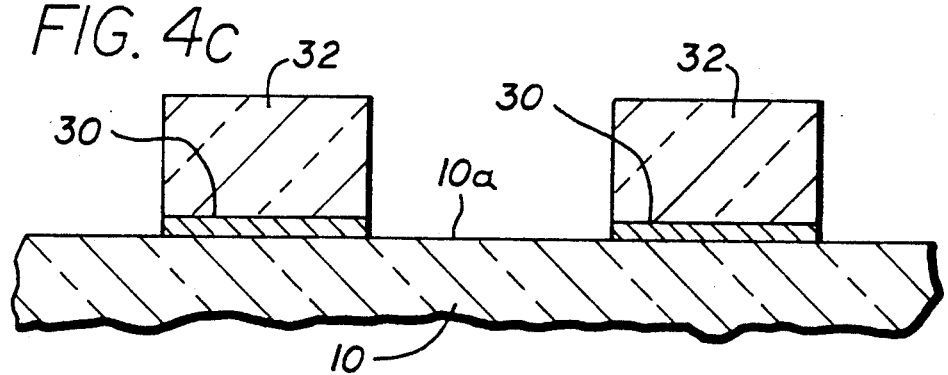
Figure 4D:
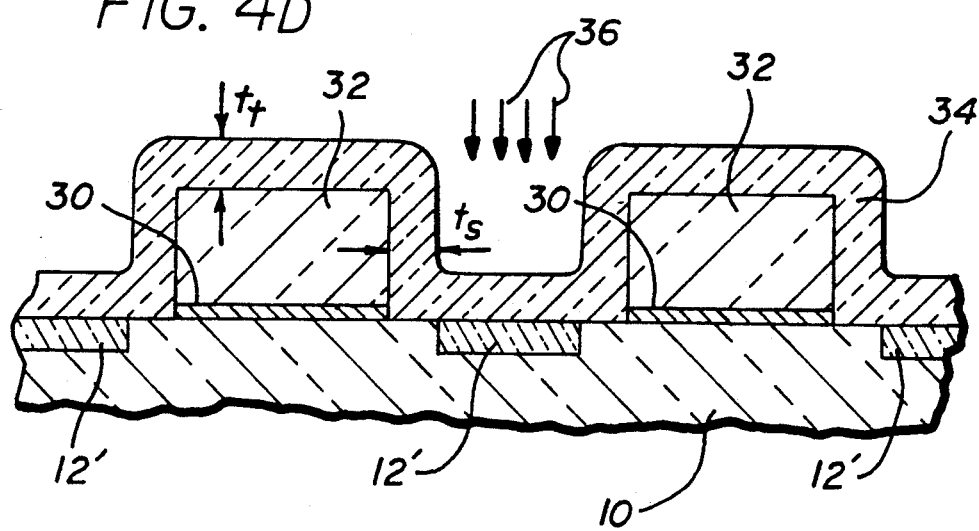

The oxide and PSG layers 32 and 30, respectively, shown in FIG. 4B, are masked and etched, with the etching stopping on the surface 10a of the substrate 10, as shown in FIG. 4C. A second oxide layer 34, again, preferably TEOS, is then deposited on the first oxide layer 32. The boron $V_T$ adjust is implanted through the deposited second oxide layer 34, as shown by arrows 36 to form the shallow p-type doping region 12'. The structure is depicted in FIG. 4D.

The oxide film 34 deposits such that the thickness on the vertical surfaces is approximately 70% of the thickness on the top surface ($t_s \approx 0.7 t_t$). The thickness of the oxide 34 is chosen such that $t_s$ provides a space S to separate the subsequent boron $V_T$ adjust implant from the n-type connector junctions 20' (seen in FIG. 4E) that diffuse from the PSG thin film diffusion sources 30. The thickness of the second ond oxide layer 34 is about 500 to 2,000 Å thick, and preferably is about 1,500 Å thick.

Even though $t_s$ may be chosen such that the $V_T$ adjust implant overlaps the laterally diffused connection junctions 20' at the end of the processing, nevertheless, the combined profiles will result in a lower electrical field than in prior art devices. This is the result expected if the as-implanted boron is distributed uniformly across region 12' and is allowed to diffuse laterally and vertically in subsequent furnace operations. Under these conditions, the lateral doping profile is governed by the error function distribution. For example, the error function distribution predicts that the concentration at the mask edge is always one-half the concentration far away from the mask edge. For these reasons, the electric field will be reduced.

The boron shallow implant 12' is performed by implanting ions 36 at a dose of about 1 to $5 \times 10^{12}$ cm$^{-2}$ and power of about 25 to 75 keV, preferably at about $3 \times 10^{12}$ cm$^{-2}$ at 50 keV. To provide punch-through protection, a medium depth implant is also done at a dose of about 1 to $4 \times 10^{12}$ cm$^{-2}$ and power of about 80 to 150 keV, preferably at about $1.5 \times 10^{12}$ cm$^{-2}$ at 140 kEV.

Figure 4E:
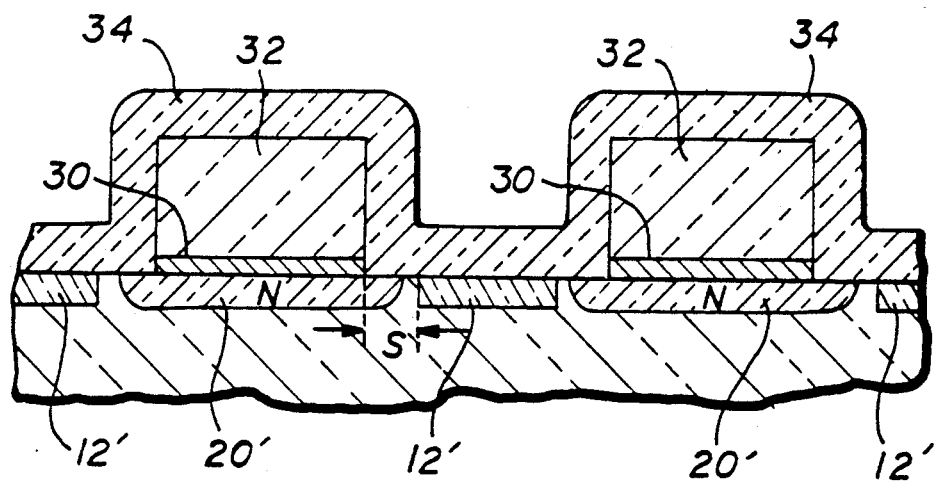

In the next step, illustrated in FIG. 4E, a connector drive-in is typically performed, such as 30 min at 900° C. in $N_2$, as in the prior art. This step drive the phosphorus dopant from the PSG oxides 30 and dopes the connector regions 20' N-type.

Figure 4F:
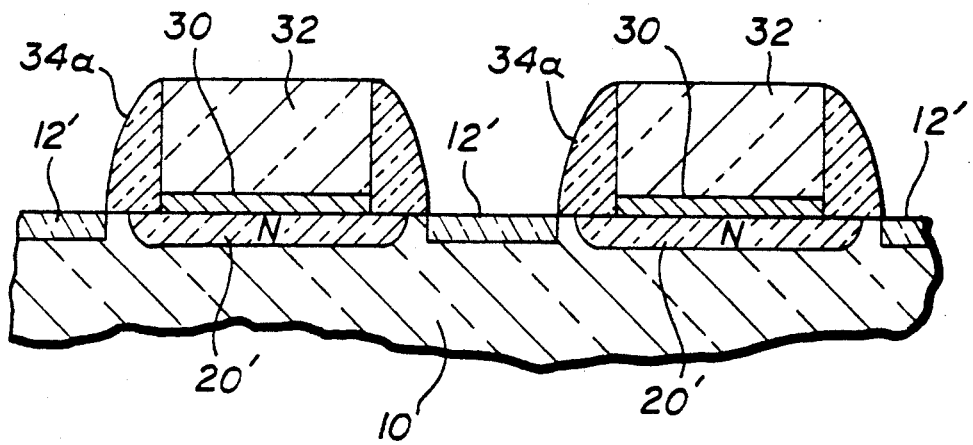

After the drive-in diffusion, the second oxide layer 34 is anisotropically etched to expose the substrate silicon 10 at the base of the etched features. However, oxide is left on the sidewalls of the oxide cuts, as shown in FIG. 4F, to form oxide spacers 34a.

Figure 4G:
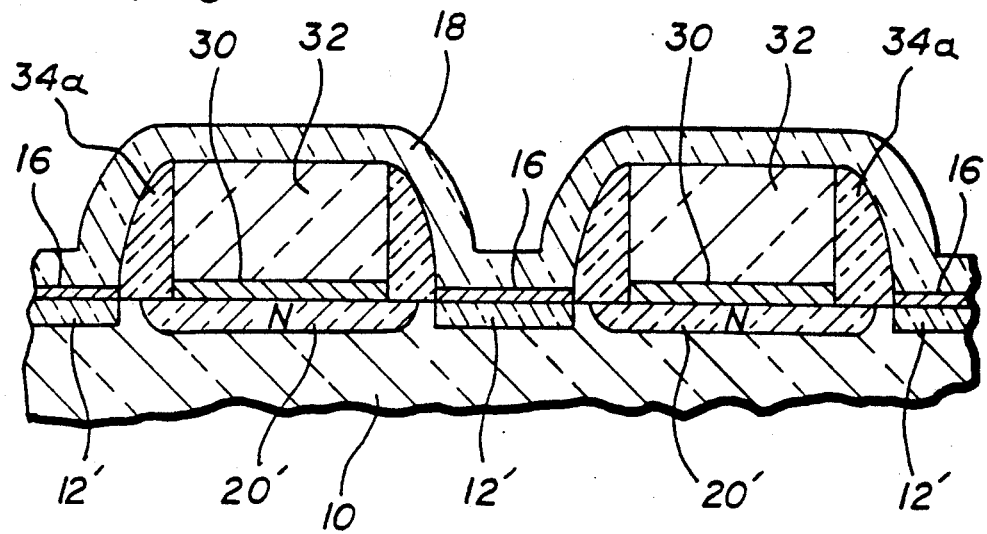

Next, the gate oxidation is performed, forming an oxide layer 16 between the etched features, followed by deposition of the gate electrode 18, here, polysilicon. The resulting structure is shown in FIG. 4G. The polysilicon thickness is typically about 1,000 Å. The polysilicon thickness is sufficient to protect the gate oxide 16 in subsequent processing.

The thickness of the gate oxide 16 is about 50 to 200 Å thick and preferably about 180 Å. The dimension S is about 100 to 2,000 Å, and preferably about 1,500 Å. The depth of the connector junction 20' is about 1,000 to 3,000 Å and preferably about 2,000 Å. The maximum drain voltage is about 2 to 7 V and preferably about 7 V. The "preferable" values are for a transistor with a 0.7 μm channel length. Smaller values would be chosen when the structure is scaled to smaller channel lengths.

The only change to the process flow from that disclosed in U.S. patent application Ser. No. 07/474,614 is the addition of a masking step (not shown) to keep the implant out of the p-channel transistor gates in the case of CMOS applications.

An advantage of this approach is that the $V_T$ adjust implant does not penetrate the gate oxide, which might otherwise cause oxide instabilities.

The foregoing provides a solution to a serious transistor scaling problem. At channel lengths of 0.7 micrometer and below, this method of channel doping is expected to address the problem of hot electron reliability. In addition, for the process described in the above-referenced U.S. Pat. Nos. 4,974,055 and 4,977,108 and in U.S. patent application Ser. No. 07/474,614, it offers more precise control of the threshold, since the effect of silicon etching during the masked oxide etch that defines the transistor gate is eliminated. This benefit will more than compensate for doping variations due to polysilicon thickness control and implant angle control. These effects all combine to give better short channel properties.

This method of channel doping offers the possibility of scaling the transistor down to 0.35 micrometer, thereby increasing the circuit packing density.

A major change in transistor scaling that may be considered is thinning of the thickness of the gate oxide 16. For the first time, it is possible to decouple gate oxide thickness from the supply voltage for scaled MOS. With the prior art approach, thinner oxides meant increasing the channel implant to reach the same threshold. The extra channel doping made the hot carrier problems worse for a given supply voltage, and the industry has devoted considerable effort in engineering LDD schemes to alleviate this problem. With the process of the invention, the channel doping can be increased and the field can be kept constant with a slight increase in the thickness of the oxide 34. Although this needs to be confirmed in simulation, the optimum device may have a thinner oxide. The minimum oxide thickness would only be dictated by the maximum field that an oxide could sustain reliably.

Now, the effect of the high aspect ratio polysilicon trench on the channel implant distribution is considered. First, consider the doping of a plane surface where the normally incident ions are implanted to a projected range of $R_p$. The doping in a small volume at depth $R_p$ consists of ions which originally hit the wafer inside a circle on the surface of radius $R_s$. $R_s$ is the straggle and is a fraction of the projected range. Straggle is due to the atomic collisions of the boron implant ion with the silicon lattice. Consider now a point directly beneath the vertical oxide edge that forms the ion mask, only half a circle is available to supply boron ions and the doping concentration will be half the doping of the planar surface case. The doping at distance $R_s$ toward the middle of the channel will rise to the planar concentration. Similarly, the doping $R_s$ toward the drain will drop to zero. This is very similar to diffusion from a mask edge, except that the distribution may be something other than the error function. Quite probably after the final diffusion, the lateral diffusion profile will be the error function.

Figure 5A:
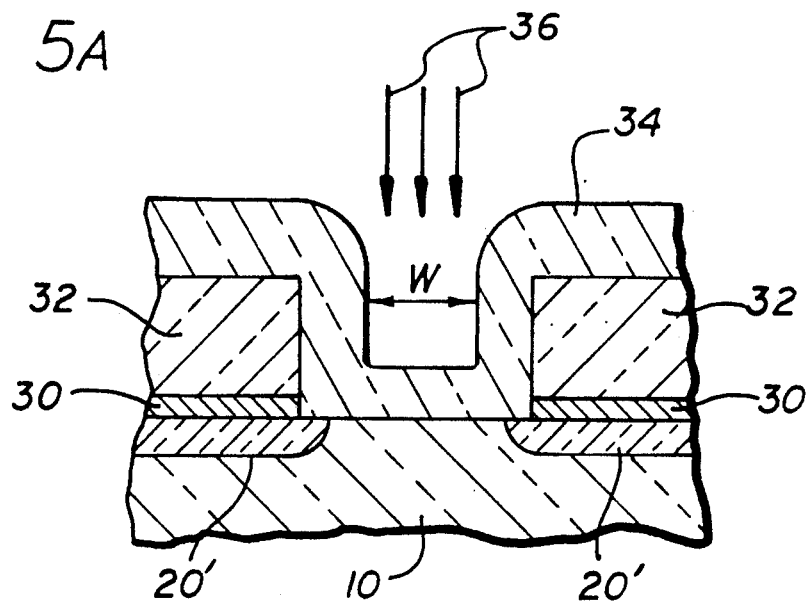
FIG. 5A is a cross-sectional view of the device during implantation to form the shallow p-doped structure.
Figure 5B:
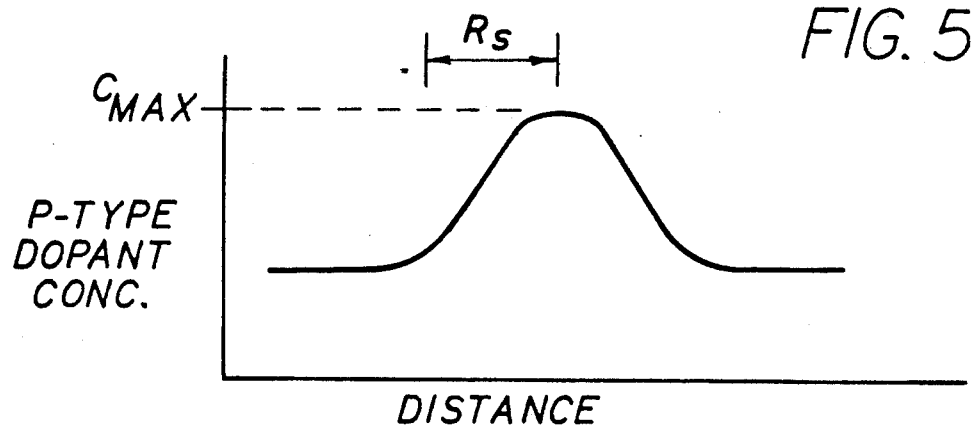
FIG. 5B, on coordinates of dopant concentration and distance, is a plot of the doping concentration in the p-doped structure of FIG. 5A.

A problem could arise if the width W of the second oxide layer 34 ever became comparable to $R_s$. In that case, the concentration in the middle of the channel would never reach the plane surface case. This is shown in FIGS. 5A and 5B. It may be necessary to modify the process flow to reduce $R_s$.

Figure 6A:
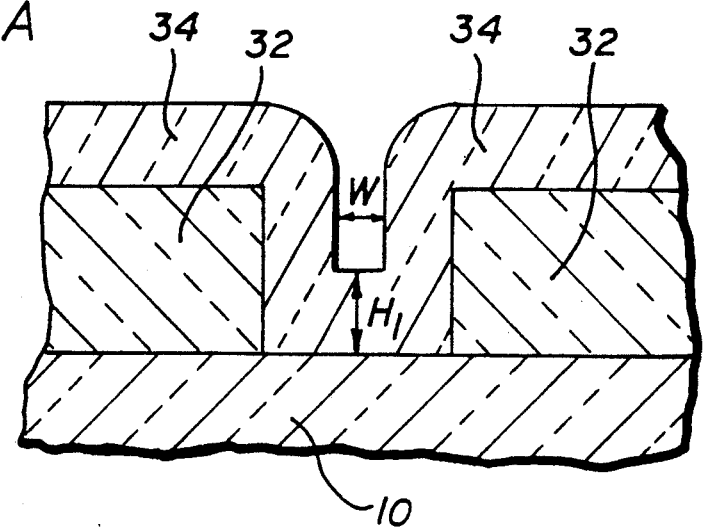

For example, it would be necessary to etch completely or part way through the oxide layer 34. With less oxide, the implant energy can be reduced, giving a lower $R_s$. FIGS. 6A and 6B illustrate this variation, wherein FIG. 6A depicts the structure prior to partial etching, in which the oxide 34 has a thickness $H_1$ and where FIG. 6B depicts the structure subsequent to partial etching, in which the oxide has a thickness $H_2$. This approach leads to $R_s < W$. However, it may be unattractive because it may be difficult to control the amount of oxide etch.

FIGS. 7A and 7B depict the situation in which an anisotropic polysilicon etch procedure is alternatively employed. In this case, a polysilicon layer 38 is deposited over the second oxide layer 34 and is anisotropically etched. The anisotropic etch stops on the oxide layer 34, leaving polysilicon spacers 38a on the sidewalls of the oxide layer. Now, the $V_T$ adjust implant can be performed at a low enough energy such that $R_s < W$. After the implant, the polysilicon spacers 38a are removed with an isotropic polysilicon etch. This variation would also circumvent the possibility of having to implant through the gate oxide 16. It would have the benefit of decoupling the parameter S from the lateral extent of the thin oxide 18. This decoupling factor therefore retains one of the advantages of the prior art process. This process also benefits in that the spacing S is not affected by lateral etching during the oxide spacer 34a etch.

What happens to the channel isolation edges should be considered when evaluating the doping approach of the invention. In general, the invention should apply to all isolation approaches. In the prior art approach, the p-type doping occurs prior to trench etch and the doping will be uniform out to the channel edges. In the approach of the invention, the normally incident implant may not give uniform doping out to the edge. From the earlier discussion, doping at distance $R_s$ from the channel edge is of concern. So long as the thickness of the oxide layer 34 exceeds $R_s$, there should be no drop-off in doping. If, however, this is not the case, it may be necessary to employ side channel implants earlier in the process. This is already being considered in the prior art process.

Process and device simulations have been performed to compare a prior art transistor with one made with the process of this invention.

For a structure with a 180 Å thick gate oxide 16, a polysilicon 18 thickness of 1,500 Å, a channel width of 100 μm, and a channel length of 0.7 μm, the following results were obtained:

1. a reduction in electric field from $5 \times 10^5$ to $3.5 \times 10^5$ V/cm for $V_G = V_D = 5.5$ V;
2. a reduction in M factor by 70%, where the M factor is the ratio of substrate current to the saturated drain current, $I_{DSAT}$. Low M factors are necessary for high reliability;

3. The $I_{DSAT}$ increased from 35 to 50 mA due to the shorter transistor channel provided by the invention.

INDUSTRIAL APPLICABILITY

The process of the invention for providing short channel transistors with controlled shallow doping is expected to find use in the fabrication of CMOS devices, including scaled p-channel and n-channel transistors.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. An improved process for fabricating short channel metal oxide semiconductor devices comprising source and drain regions separated by gate regions, wherein the process of forming a shallow channel doping region includes forming said shallow channel doping region beneath the surface of a semiconductor, forming source-drain regions of opposite conductivity type on either side of said shallow doping region, forming a gate insulator on the surface of said semiconductor above said shallow channel doping region and extending over a portion of said source-drain region adjacent said shallow channel doping region, and forming a gate electrode to said gate oxide, the improved process including:

(a) forming a doped glass layer on said substrate, said doped glass layer acting as a source of dopant to form said source-drain regions of opposite conductivity by subsequent diffusion into said silicon substrate at an elevated temperature;
   (b) forming an insulating layer on said doped glass layer;
   (c) patterning said insulating layer and said doped glass layer to form vertical structures which define said gate region, said vertical structures disposed on either side of said gate region;
   (d) forming an oxide coating on said insulating layer and on said vertical structures, said narrowed spacing between said vertical structures, said narrowed spacing being less than the distance separating said source and drain regions;
   (e) implanting ions through said oxide coating into said gate region to form said shallow channel doping region to thereby laterally space said shallow channel doping region by a distance S from said sidewalls of said vertical structures and to self-align said shallow channel doping region to said source-drain regions, said shallow channel doping region centered between said source-drain regions and separated therefrom;
   (f) anisotropically etching said oxide coating to leave said oxide coating on said sidewalls of said vertical structures to thereby form oxide spacers;
   (g) forming said gate insulator in said gate region; and
   (g) depositing said gate electrode.

2. The process of claim 1 wherein said vertical structures comprise an oxide selected from the group consisting of tetraethyl orthosilicate, deposited oxide, and doping glass.

3. The process of claim 1 wherein said doped glass consists essentially of a phosphosilicate glass to provide N-type doping of said source-drain regions.

4. The process of claim 1 wherein said oxide coating has a thickness ranging from about 500 to 2,000 Å thick.

5. The process of claim 4 wherein said thickness is about 1,500 Å.

6. The process of claim 1 wherein said implanted ions are boron, implanted at a dose of about 1 to $4 \times 10^{12}$ cm$^{-2}$ at a power of about 80 to 150 keV.

7. The process of claim 6 wherein said dose is about $1.5 \times 10^{-12}$ cm$^{-3}$ and said power is about 140 keV.

8. The process of claim 1 wherein said spacings ranges from about 100 to 2,000 Å.

9. The process of claim 8 wherein said spacings is about 1,500 Å.

10. The process of claim 1 wherein said oxide coating is reduced in thickness prior to said ion implantation.

11. The process of claim 1 wherein a polysilicon layer is deposited on said oxide layer and is patterned to leave vertical structures of said polysilicon on the sidewalls of said oxide coating and to expose a portion of said oxide coating over said gate region.

12. The process of claim 1 wherein following step (e), said source-drain regions are formed by performing a connector drive-in to diffuse said dopant from said doped glass layer.

13. The process of claim 2 wherein the thickness of said vertical structure ranges from about 3,000 to 8,000 Å.

14. The process of claim 1 wherein said oxide coating has a thickness ranging from about 500 to 2,000 Å.

* * * * *